US012603217B2

(12) United States Patent
Yang et al.

(10) Patent No.: US 12,603,217 B2
(45) Date of Patent: Apr. 14, 2026

(54) INDUCTOR STRUCTURE, CIRCUIT BOARD AND ELECTRONIC DEVICE

(71) Applicant: HUNAN HUASUN M&E TECHNOLOGY CO.LTD, Huaihua (CN)

(72) Inventors: Xiaoying Yang, Huaihua (CN); Fei Yang, Huaihua (CN); Hong Fu, Huaihua (CN); Dongsheng Liu, Huaihua (CN); Sheng Yang, Huaihua (CN); Jie Ling, Huaihua (CN)

(73) Assignee: HUNAN HUASUN M&E TECHNOLOGY CO.LTD, Huaihua (CN)

( * ) Notice: Subject to any disclaimer, the term of this patent is extended or adjusted under 35 U.S.C. 154(b) by 250 days.

(21) Appl. No.: 18/684,443

(22) PCT Filed: Oct. 26, 2023

(86) PCT No.: PCT/CN2023/126943
§ 371 (c)(1),
(2) Date: Feb. 16, 2024

(87) PCT Pub. No.: WO2025/086225
PCT Pub. Date: May 1, 2025

(65) Prior Publication Data
US 2025/0226142 A1 Jul. 10, 2025

(51) Int. Cl.
*H01F 27/24* (2006.01)
*H01F 27/28* (2006.01)
(Continued)

(52) U.S. Cl.
CPC ......... *H01F 27/24* (2013.01); *H01F 27/2828* (2013.01); *H01F 3/08* (2013.01); *H05K 1/181* (2013.01); *H05K 2201/1003* (2013.01)

(58) Field of Classification Search
CPC ........ H01F 27/24; H01F 27/2828; H01F 3/08; H05K 1/181; H05K 2201/1003
(Continued)

(56) References Cited

U.S. PATENT DOCUMENTS

2018/0001523 A1    1/2018   Huang
2019/0295760 A1    9/2019   Xia et al.
(Continued)

FOREIGN PATENT DOCUMENTS

CA        2254248 A1     5/1999
CH         445631 A     10/1967
(Continued)

OTHER PUBLICATIONS

Supplementary European Search Report for EP 23 84 4521, prepared by the European Patent Office, mailing date Feb. 14, 2025, 9 pages.

*Primary Examiner* — Andargie M Aychillhum
(74) *Attorney, Agent, or Firm* — Brooks Kushman P.C.

(57) ABSTRACT

The present application provides an inductor structure, a circuit board and an electronic device. The inductor structure includes a magnetic core column and a wire. The magnetic core column includes a first part, a second part and a third part arranged sequentially along a first direction, the first part has a first side wall facing away from the second part, and the third part has a second side wall facing away from the second part. The wire is wound around the magnetic core column and is configured to be electrically connected to the circuit board.

19 Claims, 2 Drawing Sheets

(51) Int. Cl.
   *H01F 3/08*       (2006.01)
   *H05K 1/181*      (2026.01)
(58) Field of Classification Search
   USPC ......................................................... 174/260
   See application file for complete search history.

(56)                References Cited

U.S. PATENT DOCUMENTS

| | | | | |
|---|---|---|---|---|
| 2021/0099017 A1* | 4/2021 | Parnell | ................. | H05K 1/0296 |
| 2022/0093314 A1* | 3/2022 | Modi | ...................... | H01F 27/24 |

FOREIGN PATENT DOCUMENTS

| | | | |
|---|---|---|---|
| CN | 103177850 | B | 5/2016 |
| CN | 108389679 | A | 8/2018 |
| CN | 109686539 | A | 4/2019 |
| CN | 208922859 | U | 5/2019 |
| CN | 115050557 | A | 9/2022 |
| CN | 115148474 | A | 10/2022 |
| CN | 219738707 | U | 9/2023 |

* cited by examiner

INDUCTOR STRUCTURE, CIRCUIT BOARD AND ELECTRONIC DEVICE

CROSS-REFERENCE TO RELATED APPLICATIONS

This application is the national phase entry of International Application No. PCT/CN2023/126943, filed on Oct. 26, 2023, the entire content of which is incorporated herein by reference.

TECHNICAL FIELD

The present application relates to the field of inductance device technologies, and in particular, to an inductance structure, a circuit board and an electronic device.

BACKGROUND

As an important component in electronic circuits, inductors usually play key roles in energy storage, filtering, and tuning. Among them, the chip inductor, as a surface-mounted high-power inductor, has the characteristics of miniaturization, high quality, high energy-storage and low resistance, and is widely used in various electronic devices. Inductance is a core parameter of the inductor, which directly affects the performance of the inductor. Therefore, increasing the inductance has always been the goal that inductor technology is constantly pursuing.

The current inductor structure has a limited energy storage capability, which affects the increase in inductance. Therefore, there is an urgent need for a circuit board, an electronic device and an inductor structure having a large inductance.

SUMMARY

An objective of the embodiments of the present application is to provide an inductor structure, a circuit board and an electronic device so that the inductor structure can have a larger inductance.

Technical solutions adopted in the embodiments of the present application are as follows:

In accordance with a first aspect of the present application, an inductor structure is provided, which includes a magnetic core column and a wire.

The magnetic core column includes a first part, a second part and a third part sequentially arranged along a first direction, and the first direction is perpendicular to a length direction of the magnetic core column.

The wire is wound around the magnetic core column and configured for electrical connection with a circuit board.

Where the first part has a first side wall facing away from the second part, and the third part has a second side wall facing away from the second part; the first side wall and/or the second side walls is/are arranged in a curved shape.

The second part has a first cross-section perpendicular to the length direction, the first cross-section is rectangular; and the length and width of the first cross-section meet the following condition:

$H/M \in (1.2, 1.8)$, where H is the length of the first cross-section, in mm; M is the width of the first cross-section, in mm.

In one embodiment of the present application, the length and width of the first cross-section meet the following conditions: $H \in (1.8, 2.7)$; and $M \in (1, 2.2)$.

In one embodiment of the present application, the first part has a second cross-section perpendicular to the length direction, and the third part has a third cross-section perpendicular to the length direction; the second cross-section and/or the third cross-section is/are semi-elliptical.

In one embodiment of the present application, a major axis length and a minor axis length of the second cross-section meet the following condition:

$a_1/b_1 \in (1.3, 2.5)$, where $a_1$ is the major axis length of the second cross-section, in mm; and $b_1$ is the minor axis length of the second cross-section, in mm.

And/or, a major axis length and a minor axis length of the third cross-section meet the following condition:

$a_2/b_2 \in (1.3, 2.5)$, where $a_2$ is the major axis length of the third cross-section, in mm; $b_2$ is the minor axis length of the third cross-section, in mm.

In one embodiment of the present application, the major axis length and minor axis length of the second cross-section meet the following conditions: $a_1 \in (0.9, 1.3)$ and $b_1 \in (0.4, 0.8)$.

And/or, the major axis length and minor axis length of the third cross-section meet the following conditions: $a_2 \in (0.9, 1.3)$ and $b_2 \in (0.4, 0.8)$.

In one embodiment of the present application, the first part and the third part have a same structure, and are symmetrical to each other about a center point of the second part.

In one embodiment of the present application, the first part, the second part and the third part are integrally formed.

In one embodiment of the present application, the inductor structure includes a base, and the base has a first surface and a second surface that are opposite to each other.

Where, the magnetic core column is disposed on the first surface, the wire is disposed on the magnetic core column, and at least one end of the wire is extended to the second surface.

In one embodiment of the present application, the wire has a first end and a second end that are oppositely arranged, and both the first end and the second end are extended to the second surface and are configured to be soldered on a circuit board.

In one embodiment of the present application, the base has a plurality of sides connected to the first surface and the second surface, and the first end and the second end are extended to the second surface along a same side, and the same side is any one of the plurality of sides.

In one embodiment of the present application, the wire is a flat wire, the flat wire has a flat side, and the flat side is attached to the magnetic core column with the flat side being parallel to the length direction of the magnetic core column.

In one embodiment of the present application, the inductor structure also includes a magnetic matrix, the magnetic matrix is filled and wrapped outside the magnetic core column and the wire.

Where, a magnetic permeability of the magnetic matrix is different from a magnetic permeability of the magnetic core column.

In one embodiment of the present application, the magnetic permeability of the magnetic matrix is smaller than the magnetic permeability of the magnetic core column.

In one embodiment of the present application, the magnetic permeability of the magnetic core column meets that $\mu_1 \in [25, 45]$, and the magnetic permeability of the magnetic matrix meets that $\mu_2 \in [15, 45]$.

In one embodiment of the present application, the magnetic matrix is coated with a coating, and a color space value in a Lab color mode of the coating is between (0, −10, −5) and (54, 0, 0).

In accordance with a second aspect of the present application, a circuit board is also provided, which includes the above-mentioned inductor structure and a circuit substrate, and the inductor structure is disposed on the circuit substrate.

In accordance with a third aspect of the present application, an electronic device is also provided, which includes the above-mentioned circuit board.

Embodiments of the present application provide an inductor structure, a circuit board and an electronic device. The inductor structure includes a magnetic core column and a wire. The magnetic core column includes a first part, a second part and a third part, arranged sequentially along a first direction that is perpendicular to a length direction of the magnetic core column. The first part has a first side wall facing away from the second part, and the third part has a second side wall facing away from the second part; the wire is wound around the magnetic core column and is configured for electrical connection with a circuit board. In the present application, on one hand, the first side wall and/or the second side wall are arranged in a curved shape, as the curved structure is conducive to reducing the space occupation of the magnetic core column, thus the number of turns of the wire to be wound in a limited packaging space can be increased, and thus the amount of inductance of the inductor structure is increased. On the other hand, a length-to-width ratio range of the first cross-section of the second part is also defined, compared to a structure having a square cross-section, the second part can form a larger cross-sectional area, and thus the amount of inductance of the inductor structure is increased.

BRIEF DESCRIPTION OF DRAWINGS

To more clearly illustrate the technical solutions in the embodiments of the present application, the drawings that need to be used in the description of the embodiments or exemplary technologies will be briefly introduced below. Obviously, the drawings in the following description are merely some embodiments of the present application. For persons of ordinary skill in the art, other drawings may be obtained based on these drawings without exerting creative efforts.

Figure 1:
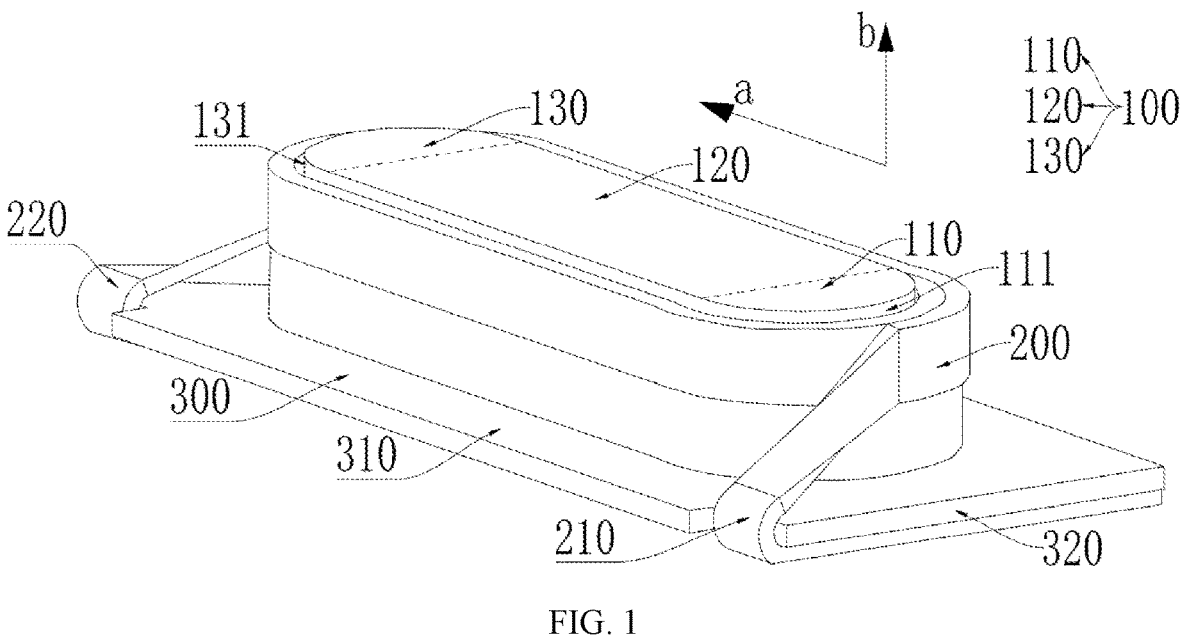
FIG. 1 is a schematic structural diagram of an inductor structure provided by an embodiment of the present application.

Symbol description for specific elements: 100—magnetic core column, 110—first part, 111—first side wall, 112—second cross-section, 120—second part, 121—first cross-section, 130—third part, 131—second side wall, 132—third cross-section, 200—wire, 210—first end, 220—second end, 300—base, 310—first surface, 320—side, 330—second surface, 400—magnetic matrix.

DETAILED DESCRIPTION OF EMBODIMENTS

In order to illustrate the objectives, technical solutions and advantages of the present application more clearly, the present application will be further described in detail below with reference to the drawings and embodiments. It should be understood that the specific embodiments described here are merely used to explain the present invention and are not intended to limit the present application.

It should be noted that when a component is referred to as being "fixed to" or "disposed on" another component, it may be directly on the other component or indirectly on the other component. When a component is referred to as being "connected to" another component, it may be directly or indirectly connected to the other component. The orientation or positional relationship indicated by the terms "upper", "lower", "left", "right", etc. are based on the orientation or positional relationship shown in the drawings, which is intended only for convenience of description and does not indicate or imply that the device or element referred thereto must have specific orientations, be constructed and operated in specific orientations, and therefore cannot be construed as limitations to the present application. For persons of ordinary skill in the art, the specific meanings of the above terms can be understood according to specific circumstances. The terms "first" and "second" are used only for convenience of description and should not be understood as indicating or implying relative importance or implicitly indicating the quantity of technical features. The phrase "a/the plurality of" means two or more, unless otherwise expressly and specifically limited.

It should be noted that as an important component in electronic circuits, inductors usually play key roles in energy storage, filtering, tuning, etc. Among them, the chip inductor, as a surface-mounted high-power inductor, has the characteristics of miniaturization, high quality, high energy-storage and low resistance, and has been widely used in various electronic devices. Inductance is the core parameter of the inductor, which directly affects the performance of the inductor.

The inductance of the inductor structure will directly affect the performance of the electronic device. For example, for the inductor structure in a transformer, if the inductance of the inductor structure does not meet the preset requirements, the output voltage of the transformer will become low, which will cause the electronic device to malfunction.

On this basis, embodiments of the present application provide an inductor structure having a large inductance, a circuit board and an electronic device. To illustrate the technical solutions provided by the present application, a detailed description will be given below with reference to specific drawings and embodiments.

Figure 2:
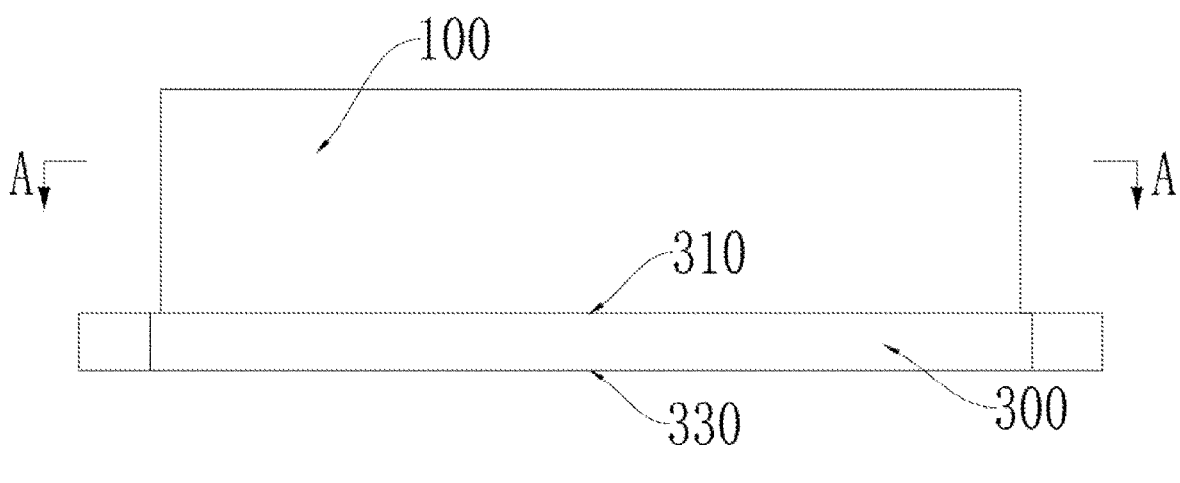
FIG. 2 is a schematic structural diagram of a magnetic core column provided by an embodiment of the present application.
Figure 3:
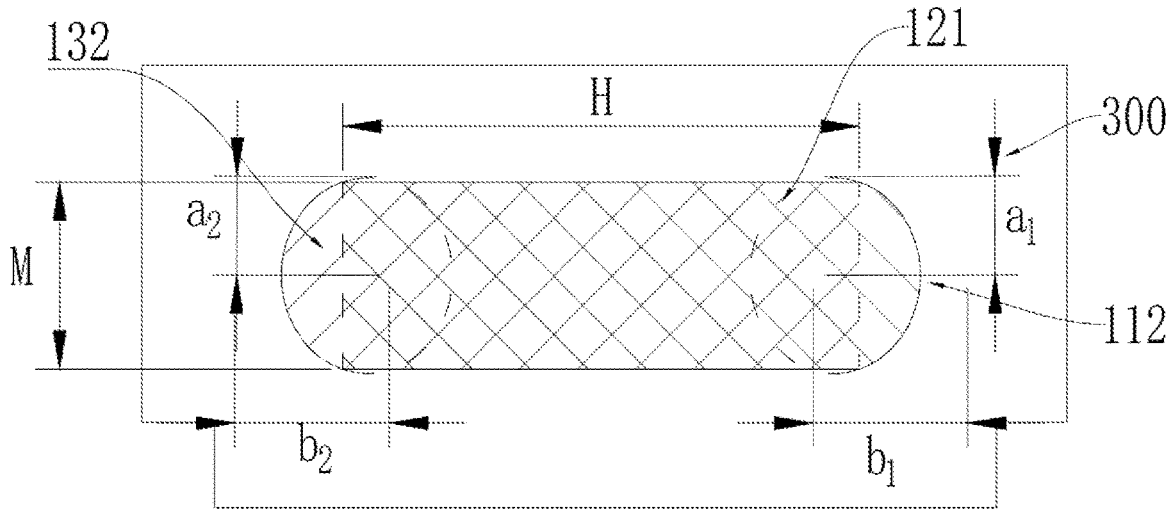
FIG. 3 is a schematic cross-sectional structural diagram along the line A-A of FIG. 2 provided by an embodiment of the present application.

Referring to FIG. 1 to FIG. 3. FIG. 1 shows a schematic structural diagram of the inductor structure provided by the present application; FIG. 2 shows a schematic structural diagram of the magnetic core column 100 provided by the present application; FIG. 3 shows a schematic cross-sectional structural diagram along the line A-A of FIG. 2 provided by the present application. The inductor structure provide in this embodiment includes a magnetic core column 100 and a wire 200. It should be noted that the wire 200, when being energized, can cooperate with the magnetic core column 100 to generate inductance.

The magnetic core column 100 includes a first part 110, a second part 120 and a third part 130 that are sequentially arranged along a first direction, and the first direction is perpendicular to a length direction of the magnetic core column 100. It can be understood that the length direction of the magnetic core column 100 is a column direction of the magnetic core column 100. As shown in FIG. 1, a direction indicated by arrow a is the first direction, and a direction indicated by arrow b is the length direction (i.e. the column direction) of the magnetic core column. In some embodiments, the first part 110, the second part 120, and the third part 130 are integrally formed.

The wire 200 is wound around the magnetic core column 100 and is configured for electrical connection with the circuit board. That is to say, the wire 200 is wrapped around to form a coil structure, and the coil structure is sleeved on the magnetic core column 100 to form an inductor.

The first part 110 has a first side wall 111 facing away from the second part 120, and the third part 130 has a second side wall 131 facing away from the second part 120. It can be understood that the first side wall 111 and the second side wall 131 are side walls at the left and right ends of the magnetic core column 100. The first side wall 111 and/or the second side wall 131 is/are arranged in a curved shape. Compared with a rectangular structure, the curved structure enables the inductor structure to have a larger inductance while occupying the same space.

The second part 120 has a first cross-section 121 perpendicular to the length direction, and the first cross-section 121 is shaped as a rectangle; and the length and width of the first cross-section 121 meet the following condition: H/M∈(1.2, 1.8); H is the length of the first cross-section 121, in millimeter (mm); M is the width of the first cross-section 121, in mm. It can be understood that compared with a square structure, the first cross-section 121 is configured as a rectangular structure, which enables the second part 120 to have a larger inductance.

Most of the magnetic core columns 100 in current inductor structures are cylindrical structures. Especially when a package size of the inductor is small, it is difficult for an inductor of such a structure to achieve a high inductance. However, in the present application, on one hand, the first side wall 111 and/or the second side wall 131 is/are arranged in a curved shape, as the curved structure is conducive to reducing the space occupation of the magnetic core column 100, thus the number of turns of the wire 200 to be wound in a limited packaging space can be increased, thereby the amount of inductance of the inductor structure is increased. On the other hand, a length-to-width ratio range of the first cross-section 121 of the second part 120 is also defined, compared to a structure having a square cross-section, the second part 120 can form a larger cross-sectional area, thereby the amount of inductance of the inductor structure is increased.

It should be noted that the inductance of the inductor structure in the present application meets the following condition:

$$L = mu \times Ae \times N^{\frac{2}{le}};$$

where L is the inductance of the inductor structure, mu is a magnetic permeability of the magnetic core column 100, and N is the number of turns of the wire 200 wound on the magnetic core column 100; Ae is a cross-sectional area of the magnetic core column 100, and le is a length of the magnetic path. It can be seen from the above formula that the amount of the inductance is positively correlated with the magnetic permeability, the number of coil turns, and the cross-sectional area of the magnetic core. However, as the size of a component is limited by the size of a physical space, contributions of the number of coil turns and the cross-sectional area of the magnetic core to inductance are necessarily competing with each other.

Particularly, when the structure of the magnetic core column 100 is changed, the cross-sectional area of the magnetic core column 100 and the number of turns of the wire 200 wound on the magnetic core column 100 may be changed. In an exemplary illustration, if a cross-section of a first magnetic core column is a square structure having a side length 2r, and a cross-section of a second magnetic core column is a circular structure having a radius r, then a cross-sectional area of the first magnetic core column is that $Ae_1=4r^2$; and a cross-sectional area of the second magnetic core column is that $Ae_2=\pi r^2$; where, $Ae_1>Ae_2$. In case that the length of the wire 200 is taken as 1, the number of turns of the wire 200 of the first magnetic core column is $N_1=1/8r$, and the number of turns of the wire 200 of the second magnetic core column is $N_1=1/2\pi$. In the first magnetic core column, $Ae_1 \times N_1=4r^2 \times 1/8r=r/2$. In the second magnetic core column, $Ae_2 \times N_2=\pi r^2 \times 1/2\pi r=r/2$.

Thus, it can be concluded that, for the cross-section of a square structure or the cross-section of a circular structure, where the side length of the square structure is equal to the diameter of the circular structure, the parameter that affects the inductance in these two structures are the same. However, in this case, the magnetic core column 100 having a circular cross-section structure can occupy less space, which is beneficial to increase the number of turns by increasing the length of the wire 200 to increase the inductance of the inductor structure, or reduce the package size of the inductor structure. In other words, when the areas of the square structure and the circular structure are the same, the inductor structure formed by the magnetic core column 100 with the circular cross-section can have a higher inductance.

In another exemplary illustration, if a cross-section of a third magnetic core column is a circular structure having a radius r, and a cross-section of a fourth magnetic core column is a rectangular structure having a width 2r and a length nr, n is any non-zero positive number; it can be seen from the above embodiment that in the third magnetic core column, $Ae_3 \times N_3=r/2$. The cross-sectional area of the fourth magnetic core column is $Ae_4=2nr^2s$, the number of turns of the wire 200 of the fourth magnetic core column is $N_4=1/(4r+2nr)$, $Ae_4 \times N_4=2nr^2 \times 1/(4r+2nr)=nr/(n+2)$. It can be seen from the above that in a case that N>2, then $Ae_4 \times N_4>Ae_3 \times N_3$, that is to say, the inductance of the inductor structure formed by the fourth magnetic core column is larger in this case; and in a case that 0<N<2, then $Ae_4 \times N_4<Ae_3 \times N_3$, that is to say, the inductance of the inductor structure formed by the third magnetic core column is larger in this case. In other words, it would be conducive to increasing the inductance of the inductor structure when the first cross-section 121 of the second part in the present application has a rectangular structure.

In some embodiments, the inductor structure is a small-size chip power inductor, which can be used as a chip-integrated micro-integrated inductor. The inductor structure has a series of unique advantages such as small size, large current, low loss, low DC (direct current) impedance, and strong resistance to electromagnetic interference, and can be directly integrated and packaged with the chip.

In one embodiment of the present application, still referring to FIG. 3, in this embodiment, the length and width of the first cross-section 121 meet the following conditions: H∈(1.8, 2.7); M∈(1, 2.2). In some embodiments, the first cross-section 121 has a length of 2.5 mm and a width of 2.0 mm. In another embodiment, the first cross-section 121 has a length of 2.0 mm and a width of 1.6 mm. In yet another embodiment, the first cross-section 121 has a length of 2.0 mm and a width of 1.2 mm.

In one embodiment of the present application, still referring to FIG. 3, in this embodiment, the first part 110 has a second cross-section 112 perpendicular to the length direction, and the third part 130 has a third cross-section 132 perpendicular to the length direction. The second cross-section 112 and/or the third cross-section 132 is/are semi-elliptical. It should be noted that the semi-elliptical shape may be half of a complete elliptical structure, or ⅓ of the complete elliptical structure or other proportions of the complete elliptical structure. It can be understood that the second cross-section 112 or the third cross-section 132 of the semi-elliptical structure can increase the inductance of the inductor structure compared to the square structure.

In one embodiment of the present application, still referring to FIG. 3, a major axis length and a minor axis length of the second cross-section 112 meet the following condition: $a_1/b_1 \in (1.3, 2.5)$; $a_1$ is the major axis length of the second cross-section 112, in mm; and $b_1$ is the length of the minor axis length of the second cross-section 112, in mm.

And, or alternatively, a major axis length and a minor axis length of the third cross-section 132 meet the following conditions: $a_2/b_2 \in (\mathbf{1.3}, \mathbf{2.5})$; $a_2$ is the major axis length of the third cross-section 132, in mm; and $b_2$ is the minor axis length of the third cross-section 132, in mm.

In one embodiment of the present application, still referring to FIG. 3, the major axis length and the minor axis length of the second cross-section 112 meet the following conditions: $a_1 \in (0.9, 1.3)$; $b_1 \in (0.4, 0.8)$. In a possible embodiment, the length of the major axis of the second cross-section 112 is 1.1 mm, and the length of the minor axis of the second cross-section 112 is 0.7 mm. In another possible embodiment, the length of the major axis of the second cross-section 112 is 0.94 mm, and the length of the minor axis of the second cross-section 112 is 0.66 mm. In yet another possible embodiment, the length of the major axis of the second cross-section 112 is 1.0 mm, and the length of the minor axis of the second cross-section 112 is 0.7 mm. In another possible embodiment, the length of the major axis of the second cross-section 112 is 1.2 mm, and the length of the minor axis of the second cross-section 112 is 0.5 mm.

In a specific embodiment, the length and width of the first cross-section 121 are 2.5 mm and 2.0 mm, respectively; and the lengths of the major axis and minor axis of the second cross-section 112 are 1.1 mm and 0.7 mm, respectively. In another specific embodiment, the length and width of the first cross-section 121 are 2.0 mm and 1.6 mm, respectively; and the lengths of the major axis and minor axis of the second cross-section 112 are 0.94 mm and 0.66 mm, respectively. In yet another specific embodiment, the length and width of the first cross-section 121 are 2.0 mm and 1.6 mm, respectively; and the lengths of the major axis and minor axis of the second cross-section 112 are 1.0 mm and 0.7 mm, respectively. In yet another specific embodiment, the length and width of the first cross-section 121 are 2.0 mm and 1.2 mm, respectively; the lengths of the major axis and minor axis of the second cross-section 112 are 1.2 mm and 0.5 mm, respectively.

And, or alternatively, the major axis length and the minor axis length of the third cross-section 132 meet the following conditions: $a_1 \in (\mathbf{0.9}, \mathbf{1.3})$; $b_1 \in (0.4, 0.8)$. In a possible embodiment, the length of the major axis of the third cross-section 132 is 1.1 mm, and the length of the minor axis of the third cross-section 132 is 0.7 mm. In another possible embodiment, the length of the major axis of the third cross-section 132 is 0.94 mm, and the length of the minor axis of the third cross-section 132 is 0.66 mm. In yet another possible embodiment, the length of the major axis of the third cross-section 132 is 1.0 mm, and the length of the minor axis of the third cross-section 132 is 0.7 mm. In yet another possible embodiment, the length of the major axis of the third cross-section 132 is 1.2 mm, and the length of the minor axis of the third cross-section 132 is 0.5 mm.

In a specific embodiment, the length and width of the first cross-section 121 are 2.5 mm and 2.0 mm, respectively; the lengths of the major axis and minor axis of the third cross-section 132 are 1.1 mm and 0.7 mm, respectively. In another specific embodiment, the length and width of the first cross-section 121 are 2.0 mm and 1.6 mm, respectively. The lengths of the major axis and minor axis of the third cross-section 132 are 0.94 mm and 0.66 mm, respectively. In yet another specific embodiment, the length and width of the first cross-section 121 are 2.0 mm and 1.6 mm, respectively. The lengths of the major axis and minor axis of the third cross-section 132 are 1.0 mm and 0.7 mm, respectively. In yet another specific embodiment, the length and width of the first cross-section 121 are 2.0 mm and 1.2 mm, respectively. The lengths of the major axis and minor axis of the third cross-section 132 are 1.2 mm and 0.5 mm, respectively.

In one embodiment of the present application, still referring to FIG. 3, in this embodiment, the first part 110 and the third part 130 have the same structure and are symmetrical to each other about the center point of the second part 120. That is, the second cross-section 112 and the third cross-section 132 have the same structure and are arranged symmetrically with each other.

In one embodiment of the present application, still referring to FIG. 3, in this embodiment, the first part 110, the second part 120 and the third part 130 are integrally formed. It should be noted that the magnetic core column is usually formed by press-molding magnetic powder.

In one embodiment of the present application, still referring to FIG. 1, in this embodiment, the inductor structure includes a base 300, and the base 300 has a first surface 310 and a second surface 330 that are opposite to each other. It can be understood that the first surface 310 is an upper surface and the second surface 330 is a lower surface. The magnetic core column 100 is disposed on the first surface 310, the wire 200 is disposed on the magnetic core column 100, and at least one end of the wire 200 is extended to the second surface 330. That is, the middle part of the wire 200 is wound around the magnetic core column, and at least one end of the wire 200 can extend to the lower surface, in this way, the wire 200 and the circuit board can be directly welded and connected without adding extra metal conductive structures, which is beneficial to improve the stability of the overall structure. In the meantime, the first end 210 and/or the second end 220 of the wire 200 is/are used as pins to be connected to the circuit board, which can help avoid risks such as virtual soldering, open circuits, vibration cracking or even breakage.

In one embodiment of the present application, still referring to FIG. 1, in this embodiment, the wire 200 has a first end 210 and a second end 220 that are oppositely arranged. Both the first end 210 and the second end 220 are extended to the second surface 330 and used for soldering connection with the circuit board. That is, both ends of the wire 200 are extended to the lower surface and are both connected to the circuit board.

In one embodiment of the present application, still referring to FIG. 1, in this embodiment, the base 300 has a plurality of sides 320 connected to the first surface 310 and the second surface 330, the first end 210 and the second end 220 are extended along a same side 320 to the second surface 330, where the same side is any one of the plurality of sides 320.

It should be noted that if the first end 210 and the second end 220 are extended to the second surface 330 along different sides 320, then a larger rotational shear stress will be formed on the first end 210 and the second end 220. The stress may cause the first end 210 and/or the second end 220 to break, or the wire 200 to rotate. In this embodiment, the first end 210 and the second end 220 are extended along the same side 320 to the second surface 330, which is beneficial to reducing the rotational shear stress that may formed on the first end 210 and the second end 220, which then reduces the risk of breakage of the first end 210 and/or the second end 220, and also helps reduce the risk of rotation of the wire 200.

In an embodiment of the present application, still referring to FIG. 1, in this embodiment, the wire 200 is a flat wire 200. The flat wire 200 has a flat side, and the flat side is attached to the magnetic core column 100. That is, the flat wire 200 is disposed on the the magnetic core column 100 with a width direction of the flat wire 200 being parallel to the length or column direction of the the magnetic core column 100. It should be noted that the flat wire 200 has higher space utilization and can effectively reduce the DC resistance (DCR), thereby the product's temperature rise characteristics and saturation characteristics can be improved.

Figure 4:
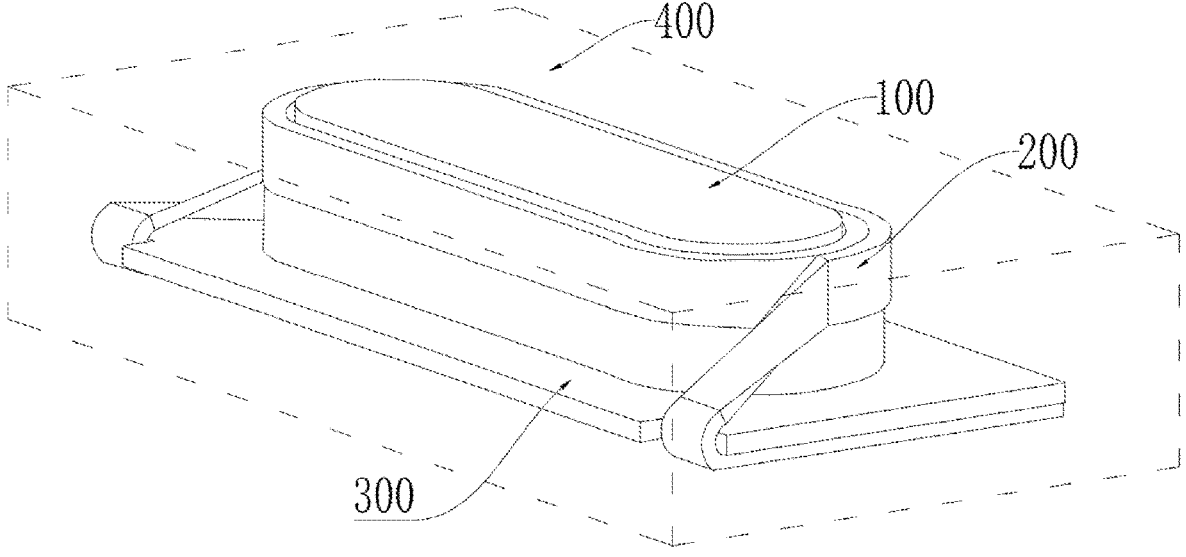
FIG. 4 is a schematic structural diagram of an inductor structure provided by another embodiment of the present application.

In one embodiment of the present application, referring to FIG. 4, which shows a schematic structural diagram of the inductor structure provided in this embodiment. The inductor structure also includes a magnetic matrix 400, the magnetic matrix 400 is filled and wrapped outside the magnetic core column 100 and the wire 200. It should be noted that the magnetic matrix 400 is mainly composed of magnetic powder and resin binder, and the magnetic property of the magnetic matrix 400 is mainly determined by the intrinsic characteristic parameters such as magnetic permeability, saturation and bias of the magnetic powder, as well as process parameters such as filling amount and molding pressure. In the inductor structure, the magnetic core column 100 and the magnetic matrix 400 form a complete magnetic body, which is used to constrain the magnetic circuit and focus energy.

The magnetic permeability of the magnetic matrix 400 is different from the magnetic permeability of the magnetic core column 100. It should be noted that the magnetic matrix 400 and magnetic core columns of different magnetic permeabilities can be adapted to reduce costs while ensuring magnetic performance. Particularly, the magnetic permeability of the molded structure may be adjusted by changing the composition, brand, etc. of the magnetic powder, and the magnetic permeability of the molded structure may also be adjusted by changing the composition ratio of the magnetic powder and the resin binder.

In one embodiment of the present application, in this embodiment, the magnetic permeability of the magnetic matrix 400 is smaller than the magnetic permeability of the magnetic core column 100. It should be noted that in the inductor structure, the magnetic core column 100 plays a main role in constraining the magnetic field, so the magnetic core column 100 may be made of magnetic powder having a higher price and better magnetic properties. Or alternatively, the ratio of magnetic powder and resin binder in the magnetic core column 100 may be increased.

In one embodiment of the present application, the magnetic permeability of the magnetic core column 100 meets that $\mu_1 \in [25, 45]$, and the magnetic permeability of the magnetic matrix meets that $\mu_2 \in [15,45]$. In some embodiments, the magnetic powder of the magnetic core column 100 and/or the magnetic matrix 400 is/are a Fe—Si—Cr—B composite system.

In one embodiment of the present application, the magnetic matrix 400 is coated with a coating, and a color space value in the Lab color mode of the coating is between (0, −10, −5) and (54, 0, 0).

It should be noted that the Lab color mode is an internationally accepted color mode, which includes three elements: brightness L, and two color-channels a and b. The brightness L ranges from 0 to 100, indicating the lightness and darkness of the color. The color contained in channel a ranges from dark green (low brightness values) to gray (medium brightness values) to bright pink (high brightness values). The color of channel b ranges from bright blue (low brightness values) to gray (a medium brightness values) to yellow (high brightness values). These colors when mixed will produce a color having a bright effect.

It can be understood that, by using values in the Lab color space, an accuracy of appearance detection and an efficiency of automatically adjusting an orientation of the inductor through an optical sorting can be greatly improved by accurately controlling a color value of a surface coating of the inductor. In other words, coatings that use conventional color space values may cause reflections and other phenomena, resulting in a situation where light sensing devices are difficult to accurately identify.

Particularly, to better implement the inductor structure in any of the above embodiments, the present application also provides a circuit board based on the inductor structure in any of the above embodiments, the circuit board includes the inductor structure in any of the above embodiments and a circuit substrate, the inductor structure is arranged on the circuit substrate.

More particularly, to better implement the circuit board in any of the above embodiments, the present application also provides an electronic device based on the circuit board in any of the above embodiments, the electronic device includes the above circuit board.

In some embodiments, the inductor structure can be used in automotive, military, medical, aerospace, and other industries having high reliability requirements, personal computers and other handheld electronic devices, as well as industrial control motherboards, graphics cards, tablet computers, laptop computers, new energy vehicle equipment, power distribution systems, modern mobile communication equipment, medical equipment and other fields.

The above are only optional embodiments of the present application and are not intended to limit the present application. Various modifications and variations may be made to the present application by persons skilled in the art. Any modifications, equivalent substitutions, improvements, etc. made within the spirit and principles of the present application shall all be included in the scope of the claims of the present application.

The invention claimed is:

1. An inductor structure, comprising:
   a magnetic core column, comprising a first part, a second part and a third part arranged sequentially along a first direction, the first direction being perpendicular to a length direction of the magnetic core column;

a wire, wound around the magnetic core column and configured to be electrically connected with a circuit board;

wherein, the first part has a first side wall facing away from the second part, the third part has a second side wall facing away from the second part, and the first side wall and/or the second side wall is/are arranged in a curved shape; and the second part has a first cross-section perpendicular to the length direction of the magnetic core column, the first cross-section is rectangular; and a length and a width of the first cross-section meet a condition of: $H/M \in (1.2, 1.8)$, wherein H is the length of the first cross-section, in mm; and M is the width of the first cross-section, in mm.

2. The inductor structure according to claim 1, wherein the length and width of the first cross-section meet conditions of: $H \in (1.8, 2.7)$; and $M \in (1, 2.2)$.

3. The inductor structure according to claim 2, wherein the first part has a second cross-section perpendicular to the length direction of the magnetic core column, the third part has a third cross-section perpendicular to the length direction of the magnetic core column, and the second cross-section and/or the third cross-section is/are semi-elliptical.

4. An inductor structure, comprising: a magnetic core column, comprising a first part, a second part and a third part arranged sequentially along a first direction, the first direction being perpendicular to a length direction of the magnetic core column; a wire wound around the magnetic core column and-is configured to be electrically connected with the circuit board; wherein, the first part has a first side wall facing away from the second part, the third part has a second side wall facing away from the second part, and the first side wall and/or the second side wall is/are arranged in a curved shape; and the second part has a first cross-section perpendicular to the length direction of the magnetic core column, the first cross-section is rectangular; and a length and a width of the first cross-section meet a condition of: $H/M \in (1.2, 1.8)$, wherein H is the length of the first cross-section, in mm; and M is the width of the first cross-section, in mm, the wire is a flat wire, the flat wire has a flat side, and the flat side is attached to the magnetic core column.

5. The inductor structure according to claim 4, wherein the major axis length and the minor axis length of the second cross-section meet conditions of: $a_1 \in (0.9, 1.3)$ and $b_1 \in (0.4, 0.8)$;

and/or, the major axis length and the minor axis length of the third cross-section meet conditions of: $a_2 \in (0.9, 1.3)$ and $b_2 \in (0.4, 0.8)$.

6. The inductor structure according to claim 4, wherein in case that the length and the width of the first cross-section are 2.0 mm and 1.6 mm, respectively, then the major axis length and the minor axis length of the third cross-section are 0.94 mm and 0.66 mm, respectively, or the major axis length and the minor axis length of the third cross-section are 1.0 mm and 0.7 mm, respectively.

7. The inductor structure according to claim 4, wherein in case that the length and the width of the first cross-section are 2.0 mm and 1.6 mm, respectively, then the major axis length and the minor axis length of the second cross-section are 0.94 mm and 0.66 mm, respectively, or the major axis length and the minor axis length of the second cross-section are 1.0 mm and 0.7 mm, respectively.

8. The inductor structure according to claim 1, wherein the first part and the third part have a same structure, and are mutually symmetric in structure with respect to a center point of the second part.

9. The inductor structure according to claim 8, wherein the first part, the second part and the third part are integrally formed.

10. The inductor structure according to claim 1, wherein the inductor structure comprises a base, and the base has a first surface and a second surface that are opposite to each other; and wherein the magnetic core column is disposed on the first surface, the wire is disposed on the magnetic core column, and at least one end of the wire is extended to the second surface.

11. The inductor structure according to claim 10, wherein the wire has a first end and a second end arranged oppositely, and the first end and the second end (220) are both extended to the second surface (330) and are configured to be soldered on a circuit board.

12. The inductor structure according to claim 11, wherein the base has a plurality of sides connected to the first surface and the second surface, the first end and the second end are extended along a same side to the second surface, and the same side is any one of the plurality of sides.

13. The inductor structure according to claim 1, wherein the inductor structure further comprises a magnetic matrix, the magnetic matrix is filled and over-coated outside the magnetic core column and the wire;

wherein, a magnetic permeability of the magnetic matrix is different from a magnetic permeability of the magnetic core column.

14. The inductor structure according to claim 13, wherein the magnetic permeability of the magnetic matrix is smaller than the magnetic permeability of the magnetic core column.

15. The inductor structure according to claim 14, wherein the magnetic permeability of the magnetic core column meets a condition of $\mu_1 \in [25, 45]$, and the magnetic permeability of the magnetic matrix meets a condition of $\mu_2 \in [15, 45]$.

16. The inductor structure according to claim 12, wherein the magnetic matrix is coated with a coating, and a color space value in a Lab color mode of the coating is between $(0, -10, -5)$ and $(54, 0, 0)$.

17. A circuit board, comprising the inductor structure according to claim 1 and a circuit substrate, wherein the inductor structure is disposed on the circuit substrate.

18. An electronic device, comprising the circuit board according to claim 17.

19. The inductor structure according to claim 1, wherein a magnetic powder of the magnetic core column and/or a magnetic powder of the magnetic matrix is/are a Fe—Si—Cr—B composite system.

* * * * *